US006326826B1

(12) United States Patent
Lee et al.

(10) Patent No.: US 6,326,826 B1
(45) Date of Patent: Dec. 4, 2001

(54) WIDE FREQUENCY-RANGE DELAY-LOCKED LOOP CIRCUIT

(75) Inventors: Kyeongho Lee; Deog-Kyoon Jeong, both of Seoul (KR)

(73) Assignee: Silicon Image, Inc., Sunnyvale, CA (US)

( * ) Notice: Subject to any disclaimer, the term of this patent is extended or adjusted under 35 U.S.C. 154(b) by 0 days.

(21) Appl. No.: 09/574,571

(22) Filed: May 17, 2000

Related U.S. Application Data

(60) Provisional application No. 60/136,640, filed on May 27, 1999.

(51) Int. Cl.[7] ......................................... H03L 7/00
(52) U.S. Cl. ......................... 327/161; 327/160; 327/48; 327/40
(58) Field of Search ........................ 327/158, 160, 327/161, 149, 151, 261, 269–271, 276–277, 284, 295, 299, 40, 47, 48

(56) References Cited

U.S. PATENT DOCUMENTS

| | | | |
|---|---|---|---|
| 4,316,150 | 2/1982 | Crosby | 331/1 A |
| 4,378,509 | 3/1983 | Hatchet et al. | 307/528 |
| 4,424,497 | 1/1984 | Fellinger | 331/1 A |
| 4,779,008 | 10/1988 | Kessels | 307/269 |
| 4,820,993 | 4/1989 | Cohen et al. | 328/155 |
| 4,970,475 | 11/1990 | Gillig | 331/25 |
| 5,101,117 | 3/1992 | Johnson et al. | 307/269 |
| 5,109,394 | 4/1992 | Hjerpe et al. | 375/119 |
| 5,233,314 | 8/1993 | McDermott et al. | 331/17 |
| 5,274,281 | 12/1993 | Hay | 307/465 |
| 5,317,283 | 5/1994 | Korhonen | 331/1 A |
| 5,373,255 | 12/1994 | Bray et al. | 331/1 A |
| 5,436,596 | 7/1995 | Folmer | 331/1 A |
| 5,511,100 * | 4/1996 | Lundberg et al. | 375/376 |
| 5,552,726 | 9/1996 | Wichman et al. | 327/149 |
| 5,592,110 | 1/1997 | Noguchi | 327/12 |
| 5,699,020 * | 12/1997 | Jefferson | 331/17 |
| 5,744,991 | 4/1998 | Jefferson et al. | 327/158 |
| 5,815,041 | 9/1998 | Lee et al. | 331/8 |
| 5,896,066 | 4/1999 | Katayama et al. | 331/17 |
| 5,920,214 * | 7/1999 | Lee et al. | 327/147 |
| 5,969,552 | 10/1999 | Lee et al. | 327/158 |
| 5,987,085 * | 11/1999 | Anderson | 375/374 |

FOREIGN PATENT DOCUMENTS 0 704 975 A1   9/1995   (EP) ................................. H03L/7/08

OTHER PUBLICATIONS

T. H. Lee et al., "a 2.5 V CMOS Delay–Locked Loop for an 18 Mbit, 500 Megabyte/s DRAM", IEEE Journal of Solid–State Circuits, vol. 29, No. 12, pp. 1491–1496, Dec. 1994.
S. Sidiropoulos et al., "A Semidigital Dual Delay–Locked Loop", IEEE Journal of Solid State Circuits, vol. 32, No. 11, pp. 1683–1692, Nov. 1997.
S. Tanoi, et al., "A 250–622 MHz Deskew and Jitter–Suppressed Clock Buffer Using Two–Loop Architecture", IEICE Trans. Electron, vol. E79–C, No. 7, Jul. 1996, pp. 898–904.
C. H. Coleman, "A New Technique for Time–Base Stabilization of Video Recorders", IEEE Transactions on Broadcasting, vol. BC–17, No. 1, Mar. 1971, pp. 29–36.
J. G. Maneatis, "Low–Jitter and Process–Independent DLL and PLL Based On Self–Biased Techniques", IEEE International Solid State Circuits Conference, Feb. 1996, pp. 130–131, 430.

* cited by examiner

Primary Examiner—Toan Tran
Assistant Examiner—Cassandra Cox
(74) Attorney, Agent, or Firm—Fenwick & West LLP

(57) ABSTRACT

A delay-locked loop (DLL), including frequency detection logic and a phase detector, is described having an operating range as wide as a conventional charge pump phase locked loop. The frequency detector logic counts the number of rising edges of the multi-phase clocks generated from a reference clock during one period of the reference clock. A loop filter is used to adjust the frequency of each multi-phase clock until frequency lock is obtained by comparing the number of rising edges. After frequency lock, phase detection logic is used to finely tune out the remaining phase error.

15 Claims, 6 Drawing Sheets

WIDE FREQUENCY-RANGE DELAY-LOCKED LOOP CIRCUIT

This application claims priority under 35 U.S.C. 119(e) from U.S. provisional patent application Ser. No. 60/136,640 having a filing date of Jun. 27, 1999 which is entitled "Unlimited Frequency Range Delay-Locked Loop Circuit," and which is hereby incorporated by reference.

BACKGROUND

1. Technical Field

This invention relates to delayed-locked loops.

2. Description of the Related Art

Skew reduction techniques using a phase-locked loop (PLL) or delay-locked loop (DLL) have become increasingly important as the required system bandwidth increases. Especially, the DLL has become more popular as a zero delay buffer because of its better stability and better jitter characteristics than the PLL. However, the conventional DLL does not offer a frequency range as wide as the PLL does because of its inherent limitation on the frequency range and the problem of false locking. PLLs and DLLs are typically used in synchronous systems wherein the integrated circuits in the system are synchronized to a common reference clock.

In the phase-locked loop, a voltage-controlled oscillator produces a local clock. The phases of the local clock and a reference clock are compared by a phase-frequency detector, with the resulting error signal used to drive the voltage-controlled oscillator via a loop filter. The feedback via the loop filter phase locks the local clock to the reference clock. Stability of the feedback loop, however, depends in part on the loop filter. The electronic characteristics of the loop filter, in turn, often depend significantly on manufacturing parameters. As a result, the same loop filter design may result in a stable feedback loop when manufactured with one process but an unstable loop when manufactured by another. It is difficult to produce a single loop filter design for use with all manufacturing processes, and the design of the loop filter typically must be optimized on a process by process basis.

The delay-locked loop generates a synchronized local clock by delaying the incoming reference clock by an integer number of periods. This approach avoids the stability problem inherent in the phase-locked loop approach. Delay-locked loops, however, have a disadvantage of narrow frequency range. The delay-locked loop adjusts the amount of additional delay in order to achieve the desired synchronization, but this adjustment is essentially a phase adjustment. The conventional delay-locked loop lacks any significant frequency adjustment, thus limiting the overall frequency range of conventional delay-locked loops. Furthermore, delay-locked loops may falsely lock on a frequency.

Accordingly, it is desirable to achieve a delay-locked loop that can operate over a wide frequency range and which can provide protection against false locking.

SUMMARY

The present invention provides a DLL that is operable over a wide frequency range, and that provides protection against false locking.

The DLL in accordance with the present invention generates a set of multiphase clocks whose delays are locked to an input reference signal. In one embodiment, the DLL includes a plurality of delay elements adapted to incrementally delaying the input reference clock to generate a set of multi-phase clocks, frequency detector logic adapted to counting the number of rising edges occurring on the set of multi-phase clocks in one period of the input reference clock and a loop filter adapted to generating a control signal to adjust the delay amount of each delay element when the number of rising edges is different from a predetermined number. The predetermined number can be set by the number of the delay elements minus one. The process of locking to the frequency of the input reference clock by comparing the number of rising edges with the predetermined number prevents false locking that occurs when the delay time through the delay chain is a multiple of the reference clock period, in which case the numbers would not match.

DETAILED DESCRIPTION

Figure 1:
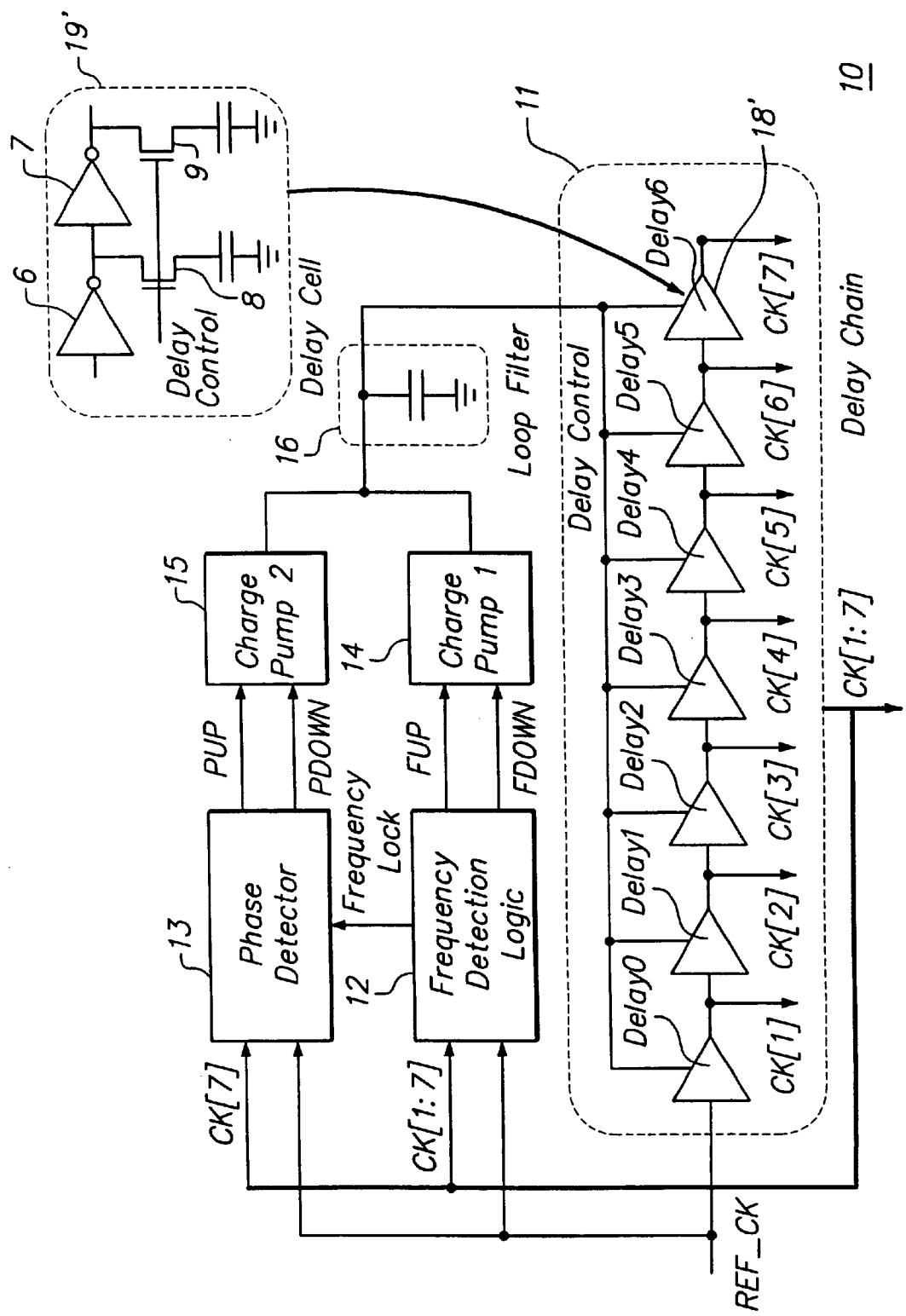
FIG. 1 illustrates one embodiment of a DLL in accordance with one embodiment of the present invention.

FIG. 1 illustrates an embodiment of a DLL in accordance with the present invention. The DLL 10 comprises a delay chain 11 having a plurality of delay elements 18', a frequency detection logic 12, a phase detector 13, two charge pumps 14, 15, and a loop filter 16. A delay cell 19' comprising two inverters 6, 7 whose outputs are controlled by a delay control signal which activates switches 8, 9 is an example of a delay element that may be used in accordance with the present invention. The plurality of delay elements 18' is adapted to generating a multi-phase clock. In this embodiment, the delay chain 11 comprises seven delay cells to generate a seven-phase clock (CK[1:7]).

The frequency detection logic 12 receives an input reference clock (REF_CK) and a seven-phase clock (CK[1:7]). The logic 12 continuously counts the number of rising edges of CK[1:7] within one period of the input reference clock to decide if the phase of each delayed edge lags or leads the reference clock, or is in a locked state. This embodiment detects the situation of false locking to a different frequency, which arises when the delay time through the chain is a multiple of the reference clock period.

The charge pump 14, charges or discharges the loop filter according to the frequency detection logic signals shown as FUP and FDOWN. During the time when frequency lock is being obtained, the phase detector 13 is disabled, and thus the charge pump 15 doesn't contribute to the loop operation.

When frequency lock is obtained, the frequency detection logic 12 asserts a frequency lock signal to the phase detector 13 before being decoupled from the loop. The charge pump 15 then can take over the loop control. The phase detector 13 and charge pump 2 15 finely tune out the remaining phase error between the input reference clock (REF_CK) and, in this embodiment, CK[7].

Figure 2:
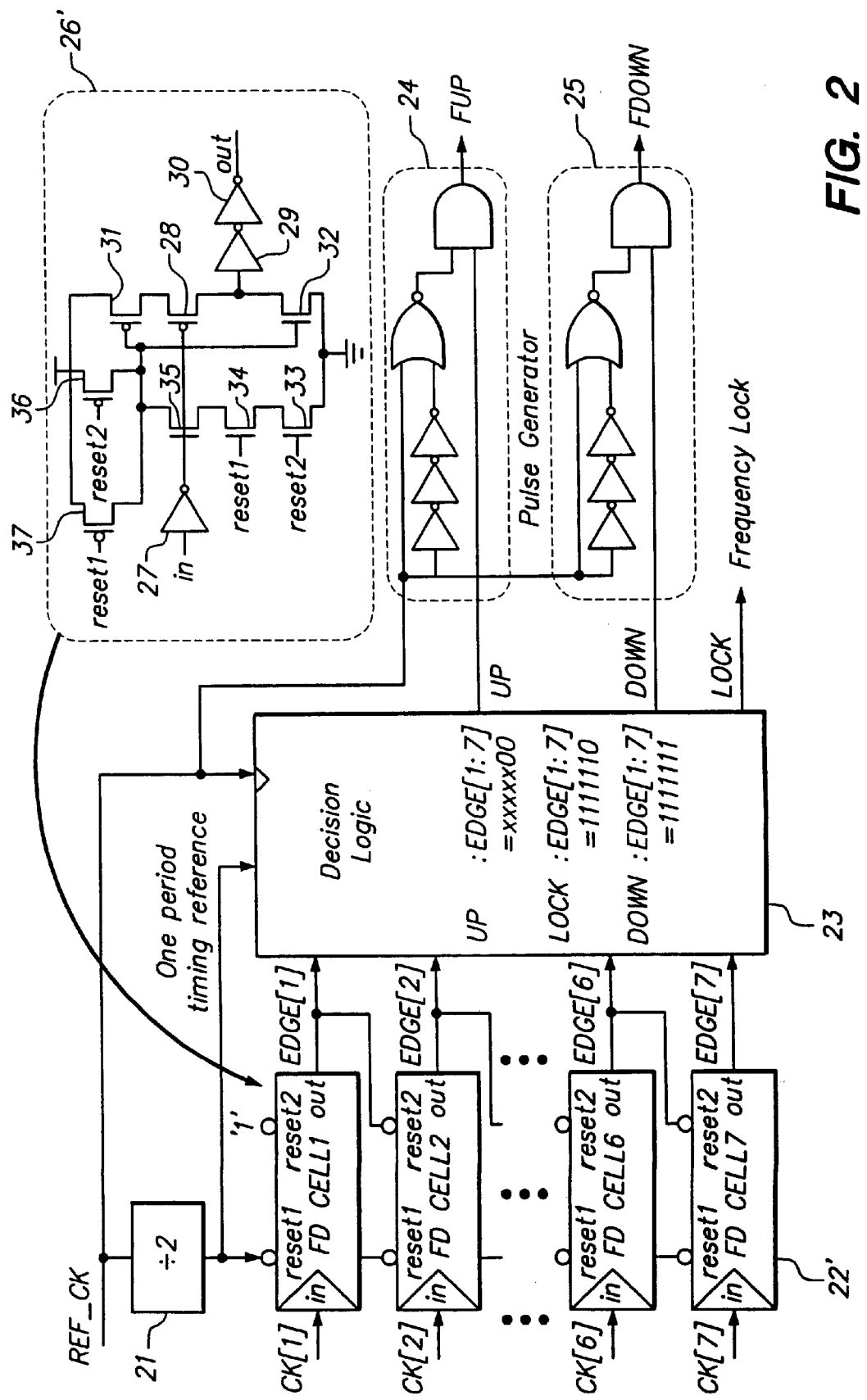
FIG. 2 shows one embodiment of frequency detection logic in accordance with the present invention.

FIG. 2 illustrates one embodiment of the frequency detection logic 12. The frequency detection logic comprises a frequency divider 21, seven frequency detection cells (FD CELL [N]) 22', decision logic 23, and two pulse generators 24, 25.

FD CELL[N] 22' receives CK[N] as a trigger pulse and moves the output (EDGE[N]) from 0 to 1 on the rising edge of CK[N]. An embodiment 26' of a frequency detection cell is shown comprising a logical combination of inverters 27, 29, and 30 and switches 31–37, an example of a switch being a field effect transistor, for outputting EDGE[N] as a "1" in response to a rising edge of CK[N] during one period of the reference clock signal.

The decision logic 23 counts the number of 1's in EDGE [1:7] within one period of the input reference clock. The decision logic asserts the frequency lock signal when the rising edge of the input clock propagates and arrives at the sixth delay cell within one period (EDGE[1:7] 1111110). In one embodiment, the decision logic may be implemented using Boolean logic. For example, the decision logic may include a counter whose output is tied to logic gates that generate a signal indicating frequency lock or the direction in which frequency needs to be adjusted.

Figure 3:
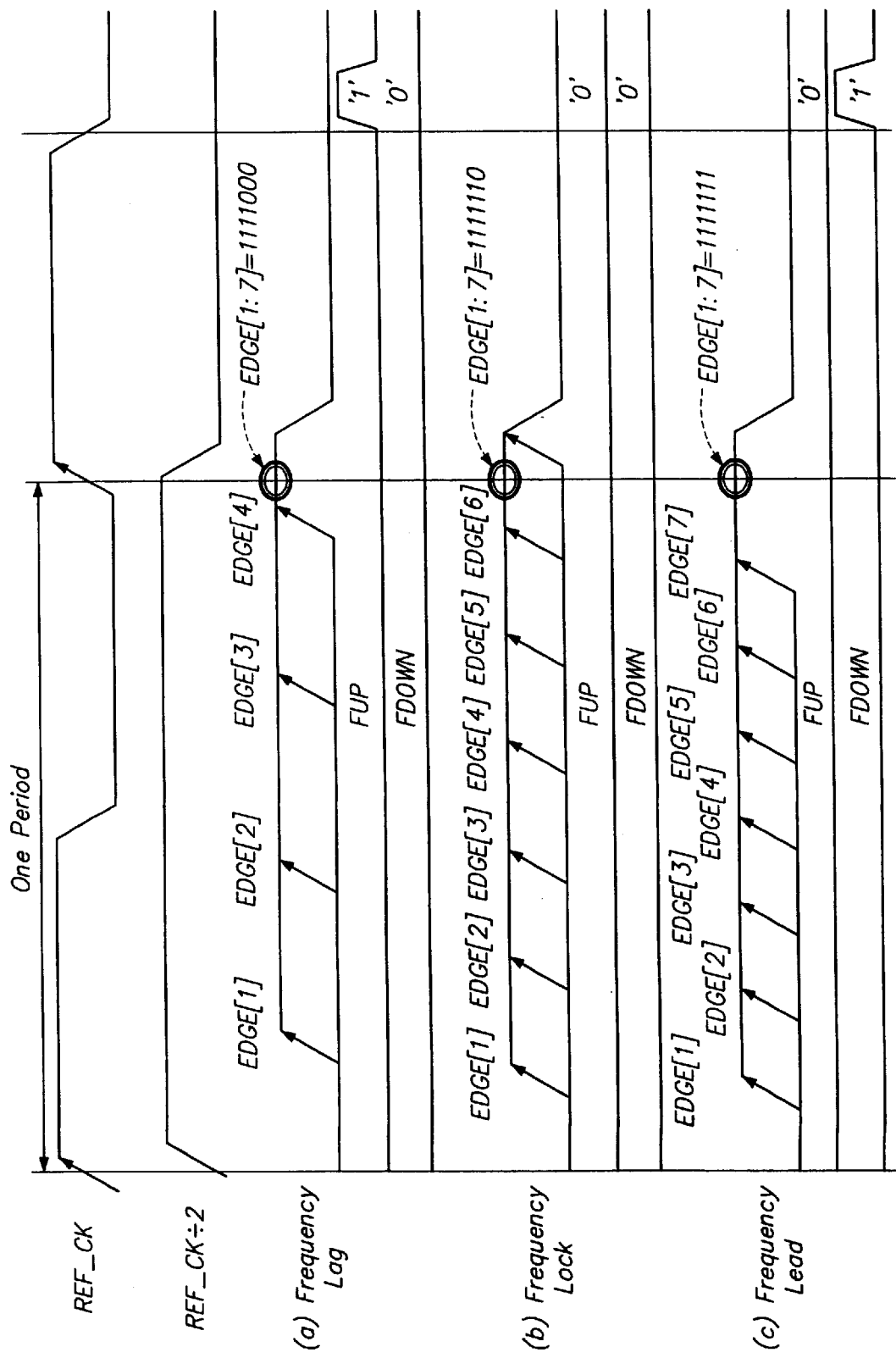
FIG. 3 is an example of a timing diagram for the embodiment of the frequency detection logic shown in FIG. 2.

FIG. 3 illustrates a timing diagram of the embodiment of frequency detection logic 12 shown in FIG. 2. Case (a) shows an example of a frequency lag. After a reset, the rising edge of the input clock propagates and arrives for this example, at the fourth delay cell within one reference clock period, resulting in EDGE[1:7]=1111000. This means that the delay chain is too slow to acquire a phase lock and the pulse generator 24 generates an FUP signal accordingly.

Case (b) illustrates an example of a frequency lock. In this embodiment where there are seven delay cells, each delay cell, when locked to the input reference frequency, should delay the input reference clock by an increment of one seventh (1/7) of one clock period. In this case, the first through sixth instances of the delayed input clock occur within one clock period, whereas the seventh instance occurs after one clock period. This is illustrated by the figure where the rising edge of the input clock propagates and arrives up to the sixth delay cell resulting in EDGE[1:7]= 1111110, a pattern that can distinguish the case of frequency lock from the case of frequency lead or frequency lag. A false locking possibility is avoided because, in the case where the delay time through the delay chain is a multiple of the input clock period, the number of rising edges would not be equal to six, the number of delay cells minus 1. A frequency lock signal then can be asserted to indicate that the phase detector can take over the loop control to tune out the remaining phase error.

Case (c) illustrates an example of frequency lead. The rising edge of the input clock propagates and passes beyond the seventh delay cell in less than one input clock period, resulting in EDGE[1:7]=1111111. The result indicates that the delay chain is too fast to acquire a phase lock and the pulse generator 25 generates an FDOWN signal.

Figure 4:
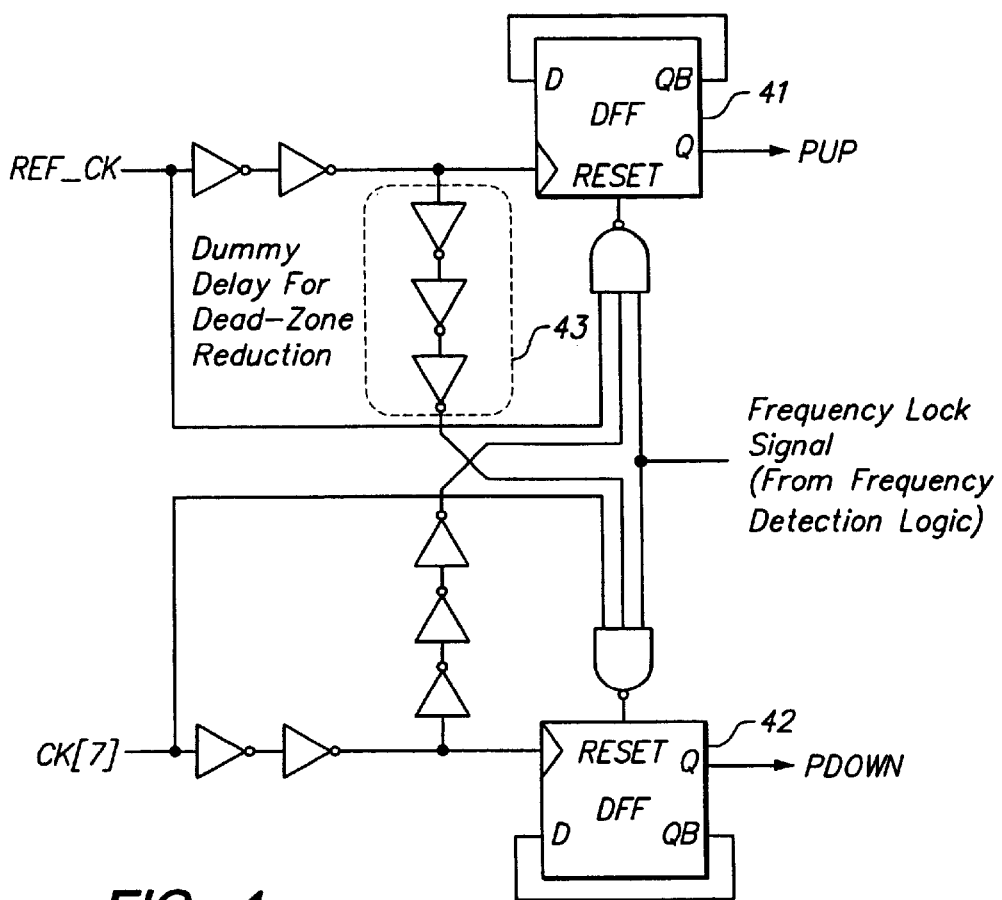
FIG. 4 shows one embodiment of a phase detector in accordance with the present invention.

FIG. 4 illustrates an embodiment of a phase detector 13 for accurate phase tuning. Resettable D-type flip-flops (DFF's) 41, 42 are used as main function blocks. Dummy delay elements 43 are inserted in the signal paths to reduce the dead zone of the detector gain curve. The frequency lock signal from the frequency detection logic 12 enables the phase detector 13 after a frequency lock is obtained.

Figure 5:
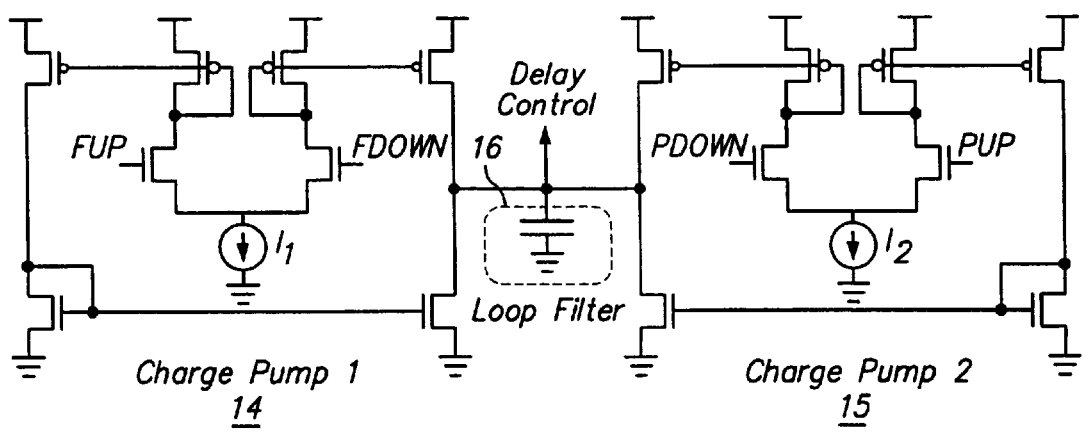
FIG. 5 illustrates embodiments of charge pumps and a loop filter that may be used in the DLL in accordance with the present invention.

FIG. 5 illustrates an example of how the two charge pumps 14, 15, one for frequency detection and the other for phase detection, and the common loop filter 16 may be embodied. Because the active side of the charge pumps shuts out the inactive side, the charge pumps do not suffer from the problem of charge sharing and control signal feed-through, which can induce undesirable phase noise.

In one embodiment, the DLL of the present invention has been fabricated using a 0.35 $\mu$m CMOS process. The area occupied by the DLL is 390 $\mu$m×500 $\mu$m. It draws 5.12 mA with 3.3 V supply, at 150 MHz.

Figure 6:
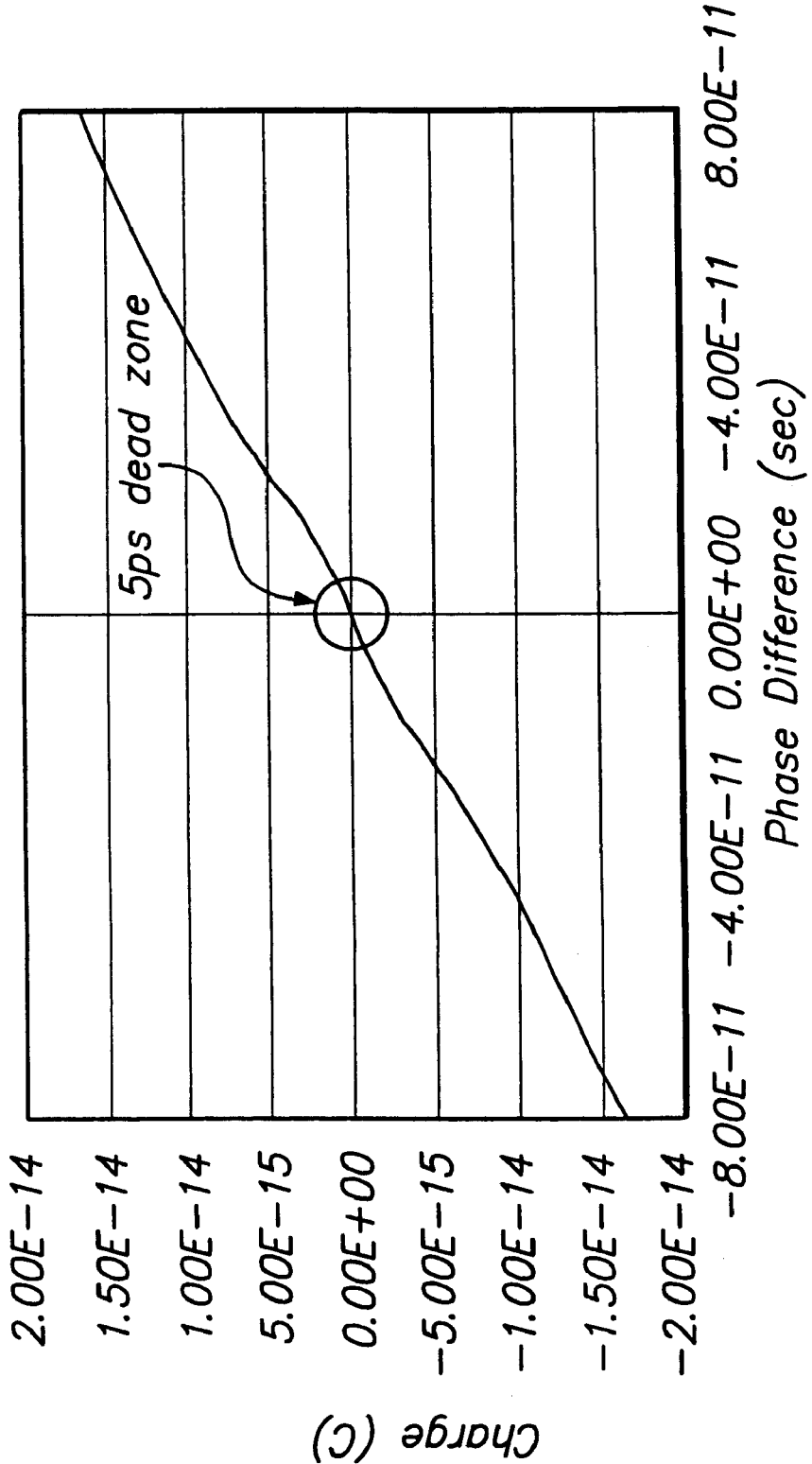
FIG. 6 is a plot showing an example of simulated gain of overall phase detection.

FIG. 6 illustrates an example of a simulated gain of the overall phase detection. It illustrates that the dead zone of the phase detection can be reduced to 5 picoseconds. The simulation is based on a circuit simulation using a device model.

Figures 7A, 7B:
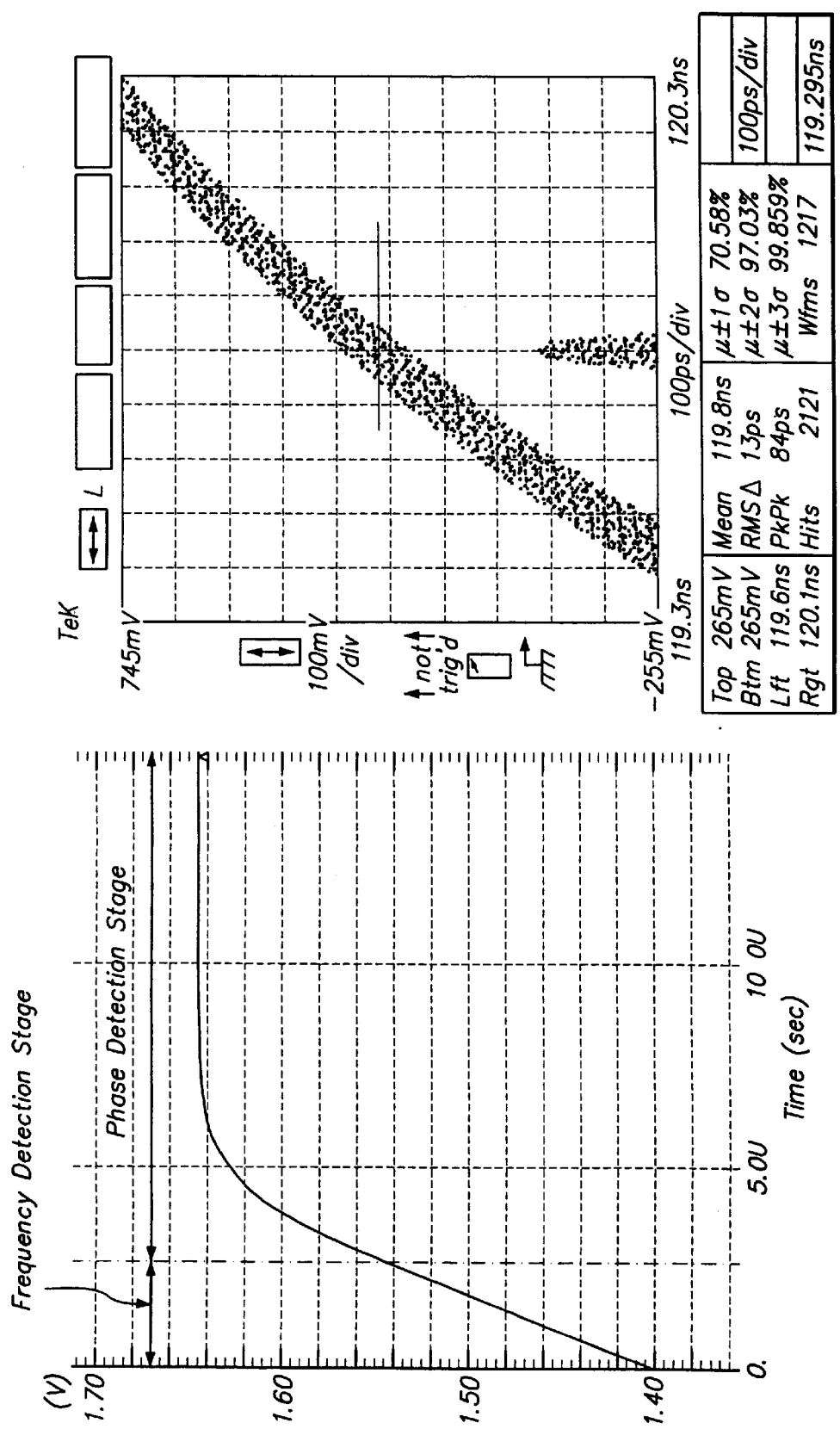
FIG. 7(a) shows an example of a simulated waveform of a delay control voltage.
FIG. 7(b) shows an example of a measured DLL jitter histogram.

FIG. 7(a) illustrates the simulated waveform of the delay control voltage. The linear portion of the curve indicates the frequency detection stage, whose slope is controlled by the current source I1 for the charge pump as embodied in FIG. 5. The nonlinear portion indicates the fine phase tuning on the phase detection stage.

FIG. 7(b) illustrates an example of a measured DLL jitter histogram with the root mean square (rms) value of 13 picoseconds in the 150 MHz operation. The measured frequency range is from 9.5 MHz to 203 MHz, which is limited only by the minimum delay time of the delay chain.

While the invention has been described with reference to various embodiments, it is not intended to be limited to only these embodiments. It will be appreciated by those of ordinary skill in the art that many modifications can be made to the structure and form of the described embodiments without departing from the spirit and scope of this invention.

What is claimed is:

1. A delay-locked loop for generating a set of multiphase clocks whose delays are locked to an input reference signal, comprising:
   a plurality of delay elements adapted to incrementally delaying the input reference clock to generate a set of multi-phase clocks;
   a frequency detector logic adapted to counting the number of rising edges of said set of multi-phase clocks in one period of said input reference clock; and
   a loop filter adapted to generating a control signal to adjust the delay amount of each delay element when the number of rising edges is different from a predetermined number.

2. The delay-locked loop of claim 1, wherein the delay element comprises an inverter.

3. The delay-locked loop of claim 1, wherein the predetermined number is the number of said delay elements minus one.

4. The delay-locked loop of claim 1, wherein the frequency detection logic further comprises:
   a frequency divider adapted to generating a half-frequency clock whose frequency is half of the reference clock.

5. The delay-locked loop of claim 4, wherein the frequency detection logic further comprises:
   a plurality of frequency detection cells whose outputs are set in response to the rising edges of said multiphase clocks.

6. The delay-locked loop of claim 5, wherein the frequency detection logic further comprises:

a decision logic adapted to counting the number of set frequency detection (FD) cells in one period of said reference clock and generating a first signal when the number of set FD cells exceeds a predetermined number and a second signal when it falls below the predetermined number.

7. The delay-locked loop of claim 6, wherein said loop filter comprises means for generating a charge-up signal in response to said first signal and a charge-down signal in response to said second signal.

8. The delay-locked loop of claim 6, wherein said loop filter comprises a charge pump generating a chargeup signal in response to said first signal and a charge-down signal in response to said second signal.

9. The delay-locked loop of claim 1, further comprising a phase detector adapted to comparing the phases of said input reference clock and one of said multiphase clocks.

10. The delay-locked loop of claim 9, wherein said phase detector comprises:
   a first D-type flip flop adapted to generating a pulse adapted to signaling a second charge pump to charge;
   a second D-type flip flop adapted to generating a pulse adapted to signaling the second charge pump to discharge;
   a first dummy delay adapted to delaying said reference clock signal to reduce dead-zone; and
   a second dummy delay adapted to delaying said one of the multiphase clocks to reduce dead-zone.

11. A delay-locked loop for generating a set of multiphase clocks whose delays are locked to an input reference signal, comprising:

means for delaying the input reference clock by incremental delays to generate a set of multi-phase clocks;

means for counting the number of rising edges of said set of multi-phase clocks in one period of said input reference clock; and means for adjusting the incremental delays when the number of rising edges of said multiphase clocks is different from a predetermined number.

12. The delay-locked loop of claim 11, wherein the predetermined number is the number of said multi-phase clocks minus one.

13. A method of generating a set of multiphase clocks whose delays are locked to an input reference signal, comprising:

generating a set of multi-phase clocks in response to a reference clock;

counting the number of rising edges of said set of multi-phase clocks in one period of said input reference clock; and adjusting the frequency of each multi-phase clock when the number of rising edges is different from a predetermined number.

14. The method of claim 13, further comprising:
   adjusting the phase of each multi-phase clock until the phase of one of the multi-phase clocks is locked to the phase of the input reference signal.

15. The method of claim 14, wherein the predetermined number is the number of said multi-phase clocks minus 1.

* * * * *